United States Patent [19]

Moon et al.

[11] Patent Number: 5,181,085
[45] Date of Patent: Jan. 19, 1993

[54] COMPOUND SEMICONDUCTOR DEVICE WITH BIPOLAR TRANSISTOR AND LASER DIODE

[75] Inventors: Seung H. Moon; Yung S. Yoon, both of Seoul, Rep. of Korea

[73] Assignee: Samsung Electronics Co., Ltd., Suweon, Japan

[21] Appl. No.: 780,466

[22] Filed: Oct. 22, 1991

[30] Foreign Application Priority Data

Apr. 3, 1991 [KR] Rep. of Korea .................. 91-5361

[51] Int. Cl.$^5$ ............................................ H01L 33/00
[52] U.S. Cl. ......................................... 257/94; 372/50;
372/48; 372/43; 257/97; 257/197; 257/198; 257/96
[58] Field of Search ................ 357/17, 43, 16, 34, 357/17 DC; 372/50, 43, 48

[56] References Cited

U.S. PATENT DOCUMENTS

| | | | |
|---|---|---|---|
| 4,956,682 | 9/1990 | Ohnaka et al. | 372/50 X |
| 5,038,185 | 8/1991 | Thornton | 372/50 X |
| 5,051,372 | 9/1991 | Sasaki | 371/50 X |

OTHER PUBLICATIONS

Shibata et al., "Monolithic Integration of an InGaAsP-/InP Laser Diode with Heterojunction Bipolar Transistors," *Appl. Phys. Lett.* 45(3), Aug. 1984, pp. 191-193.
Katz, et al., "A Monolithic Integration of GaAs/-GaAlAs Bipolar Transistor and Heterostructure Laser," *Appl. Phys. Lett.* 37(2), Jul. 5, 1980, pp. 211-213.

*Primary Examiner*—William Mintel
*Attorney, Agent, or Firm*—Ladas & Parry

[57] ABSTRACT

A semiconductor device, in which the topography becomes flat and an LD is rapidly driven by an HBT since the HBT is formed in the vertical structure of the LD, holding many layers in common with the LD, and also, the holes flow only into a predetermined part by forming an additional layer for restricting the flow of holes. Thus, the size of the compound semiconductor device can be minimized and a flat topography can be obtained while the threshold current can be lowered by restricting the flow of holes in the LD.

7 Claims, 1 Drawing Sheet

COMPOUND SEMICONDUCTOR DEVICE WITH BIPOLAR TRANSISTOR AND LASER DIODE

BACKGROUND OF THE INVENTION

The present invention relates to a compound semiconductor device, and more particularly to, a device which provides a single chip by forming a heterojunction bipolar transistor (HBT) into the vertical structure of a laser diode.

Recently, the necessity for high speed computers, high frequency, and optical communication has increased according to the developments of an information communication society. However, conventional Si devices have limits in satisfying such needs. Thus, compound semiconductors which have superior material properties have been extensively investigated.

Among the compound semiconductors, GaAs has high operation speed and low power consumption due to its high electron mobility and semi-insulating property, thereby having many advantages for military or space communication.

By using such superior material properties of GaAs, various devices have been developed. As typical devices, there are the laser diode (LD), the metal-semiconductor field effect transistor (MESFET), heterojunction bipolar transistor (HBT), and the delta-doped field effect transistor (δ-doped FET).

The LD emits light by recombining an electron with a hole in the gain medium of a P-N junction when a sufficient forward current flows. Since the LD is small and provides the coherent light, it is widely used as a light source in optical communication and optical signal processing.

On the other hand, the HBT utilizes the heterojunction of an emitter with a large energy bandgap and a base with a small energy bandgap. Then the hole injection from the base to the emitter is prevented and the electron injection from the emitter to the base becomes easier, increasing the electron injection efficiency of the emitter and thus resulting in the increase of current.

Thus, the HBT might be used as an LD driver device. The driving methods of the LD are divided into internal driving and external driving according to the position of the HBT. The external driving uses the hybrid IC of the LD and HBT by bonding and wiring, and the internal driving incorporates the LD and HBT in the same chip.

However, external driving has some problems in that the devices might be abnormally operated by the noise due to the parasitic capacitance in the high speed operation, and the cost and the size are increased due to the hybrid process.

Thus, OEIC (Optoelectronic Integrated Circuit) is studied in order to solve such problems by forming the LD and HBT in the same chip.

FIG. 1 is a cross-sectional view of a conventional compound semiconductor. This compound semiconductor is an OEIC composed of a self-aligned HBT and an LD. The compound semiconductor is divided into the HBT region (H-region) and LD region (L-region). Also, a semi-insulating GaAs substrate 1 is used in common.

An N+-type GaAs layer 3 is formed on the GaAs substrate 1, and on the N+-type GaAs layer 3 there are sequentially formed, an N-type AlGaAs layer 5 serving as a collector region, a P+-type GaAs layer 7 serving as a base region, an N-type AlGaAs layer 9 serving as an emitter region, and an N+-type GaAs layer 11 serving as a cap region are sequentially formed.

The N+-type GaAs layer 3 becomes a sub-collector region in the H-region. A T-shaped emitter electrode 17 is formed in a predetermined part of the N+-type GaAs layer 11.

By using this emitter electrode as an implant mask, a P+-region 13 is formed which is overlapped with the N-type AlGaAs layer 5.

A base electrode 18 is formed on the surface of the P+-region 13 and an isolation region 15 is formed at the exposed part of the N+-type GaAs layer 3 by ion-implant of H2.

Also, the N-type AlGaAs layer 5, a P-type or N-type GaAs layer 23 serving as an active layer, a P-type AlGaAs layer 25 serving as a clad region, and a P+-type GaAs layer 26 serving as a cap region are stacked on the LD region (L-region) of the N+-type GaAs layer 3. The N+-type GaAs layer 3 is used as a buffer region.

An insulating layer 28 is formed on the P+-type GaAs layer 26 except for a predetermined part and a high-resistivity region 27 which is overlapped with the N-type AlGaAs layer 5 is formed under the insulating layer 28.

On the insulating layer 28, a P-type electrode 29 is formed in contact with the P+-type GaAs layer 26.

Also, a common electrode 19 serving as a collector electrode of the HBT and an N-type electrode of an LD is formed on the exposed groove 21 in the N+-type GaAs layer 3 between the HBT region (H-region) and the LD region (L-region).

The compound semiconductor device which incorporates both the HBT and the LD in the same chip is used as an OEIC in the optical communication systems. In this OEIC, the LD emits the light, and the HBT amplifies it to simply drive the LD so that the parasitic capacitance is minimized, thereby preventing abnormal operation and obstacles during high speed operation while decreasing the cost and the chip area.

In the conventional compound semiconductor, however, the HBT and the LD are separately formed in each region so that the chip area can be large. Also, the structure is complicated and the topology is bad.

SUMMARY OF THE INVENTION

An object of the present invention is to provide a compound semiconductor device which minimizes the total chip area by excluding an HBT area.

Another object of the present invention is to provide a compound semiconductor device with a good topology.

A further object of the present invention is to provide a compound semiconductor device with a low threshold current. According to the present invention, there is provided a compound semiconductor device comprising an LD and an HBT in the same chip, the device comprising an LD part composed of a first conductive-type compound semiconductor substrate, a first conductive-type first compound semiconductor layer formed on the compound semiconductor substrate as a lower cladding layer, a second compound semiconductor layer formed on the first compound semiconductor layer for emitting light, a second conductive-type third compound semiconductor layer formed on the second compound semiconductor layer as an upper cladding layer, and a third electrode, and an HBT part composed of a first conductive-type fourth compound semiconductor layer formed on the third compound semiconductor layer as a base region, a second conductive-type fifth compound semiconductor layer formed on the fourth compound semiconductor layer as an emitter region, a second conductive-type first electrode formed on a predetermined part of the fifth compound semiconductor layer, a first conductive-type second electrode formed on both sides of the first electrode on the fifth compound semiconductor layer, a first conductive-type impurity region formed under each second electrode for connecting the third compound semiconductor layer to the fourth compound semiconductor layer, and a third compound semiconductor layer serving as a collector region, and utilized in common with the LD part.

DETAILED DESCRIPTION OF THE PREFERRED EMBODIMENT

Figure 1:
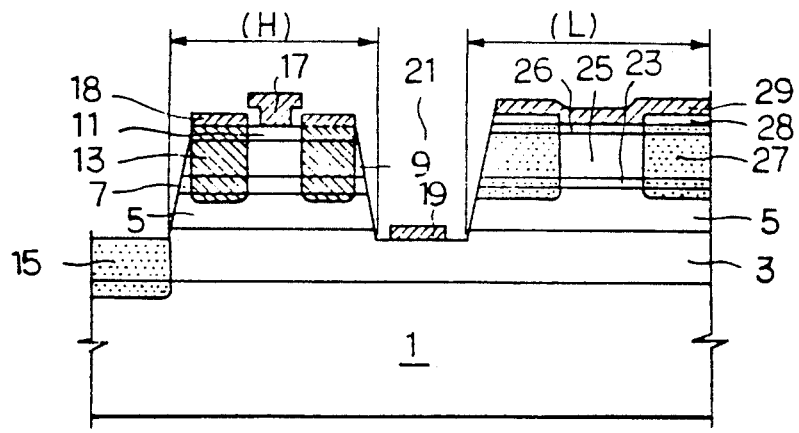
FIG. 1 is a cross-sectional view of a conventional compound semiconductor device.
Figure 2:
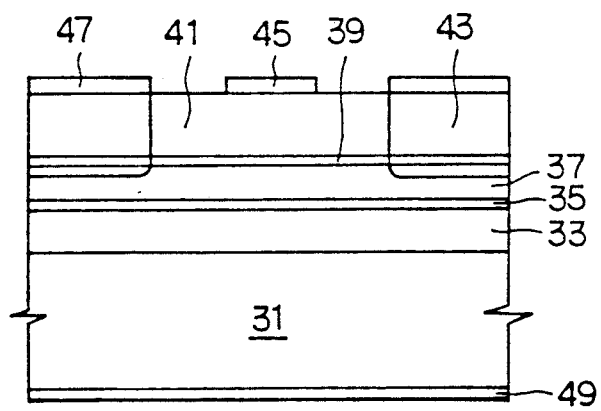
FIG. 2 is a cross-sectional view of the preferred embodiment of a compound semiconductor device according to the present invention.

FIG. 2 is a cross-sectional view of the preferred embodiment of a compound semiconductor device according to the present invention.

The semiconductor device as shown in FIG. 2 is an OEIC which incorporates an HBT and an LD in the same chip.

The HBT is to be a driving device and the LD is to be an optical device.

A P+-type GaAs compound semiconductor substrate 31 has <100> orientation and is doped by impurities such as Ge or Zn with a dose of $1 \times 10^{17} \sim 1 \times 10^{18}$ ions/cm$^3$.

On the substrate 31 there are sequentially stacked a first compound semiconductor layer 33 of P-type Alx-Ga1-xAs, a second compound semiconductor layer 35 of P-type Aly Ga1-yAs. a third compound semiconductor layer 37 of N-type AlxGa1-xAs, a fourth compound semiconductor layer 39 of P-type GaAs, and a fifth compound semiconductor layer 41 of N-type AlxGa1-zAs.

A first electrode 45 of Ge/Mo/W is formed on a predetermined part of the fifth compound semiconductor layer 41 and a second electrode 47 of Au/Mn is formed on both sides of the first electrode 45.

Beneath the second electrodes 47, a P+-type region 43 is formed and overlaps the third compound semiconductor layer 37 by a predetermined thickness.

Also, a third electrode 49 of Au/Zn is formed beneath the compound semiconductor substrate 31.

The first and second electrodes 45 and 47 are used as the emitter and base electrodes of the HBT, respectively, and the third electrode 49 is used as the P-type electrode of the LD.

The second compound semiconductor layer 35 is used as an active region for emitting the light by recombining electrons and holes, and the first and third compound semiconductor layers 33 and 37 are used as P-type and N-type cladding regions for guiding the emitted light.

Thus, the energy bandgap of the first and third compound semiconductor layers 33 and 37 must be larger than that of the second layer 35, where the first and third compound semiconductor layers 33 and 37 must contain more Al than the second layer 35 does, that is, $1 \geq X > Y \geq 0$. Also, the third compound semiconductor layer 37 is used as the collector region of the HBT.

The fourth and fifth compound semiconductor layers 39 and 41 are used as the base and emitter regions of the HBT, respectively.

In order to prevent hole injection from the fourth compound semiconductor layer 39 to the fifth compound semiconductor layer 41 and make electron injection from the fifth compound semiconductor layer 41 to the fourth compound semiconductor layer 39 easy, the fifth compound semiconductor layer 41 must contain much Al.

In general, the value of Z representing the amount of Al is better, when larger, and in the present invention, it is almost equal to the value X representing the amount of Al contained in the third compound semiconductor layer 37. In addition, the fourth compound semiconductor layer 39 is light formed to make the flow of holes fast.

Figure 3:
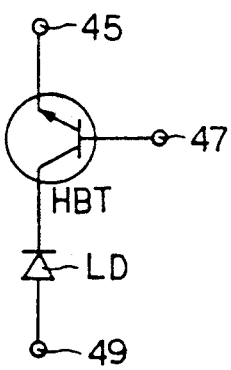
FIG. 3 is an equivalent circuit diagram of the compound semiconductor device in FIG. 2.

As mentioned above, the chip area can be largely reduced since the HBT is integrated into the vertical structure of the LD, and also the topography can be improved since the first and second electrodes 45 and 47 are formed on the fifth compound semiconductor layer 41. FIG. 3 is an equivalent circuit diagram of the compound semiconductor device shown in FIG. 2.

The operation of the compound semiconductor device shown in FIG. 2 is described in reference with FIG. 3.

A forward bias voltage is applied between the first electrode 45 and the second electrode 47 and a reverse bias voltage is applied between the second electrode 47 and the third electrode 49.

Then, the holes are injected into the second electrode 47, flowing to the fourth compound semiconductor layer 39 through the P-type region 43, and the electrons are injected into the first electrode 45, flowing to the fifth compound semiconductor layer 41, where the electrons are majority carriers and the holes are minority carriers.

Thus, the holes in the fourth compound semiconductor layer 39 are recombined with some electrons in the fifth compound semiconductor layer 41, forming the current path. The remaining electrons flow into the third compound semiconductor layer 37 and are recombined with the holes injected through the third electrode 49 in the second compound semiconductor layer 35, emitting light.

The emitted light is limited to the second compound semiconductor layer 35 by the energy bandgap difference and its intensity is proportional to the number of holes injected through the second electrode 47. Thus, the light intensity of the LD can be controlled by the HBT.

Figure 4:
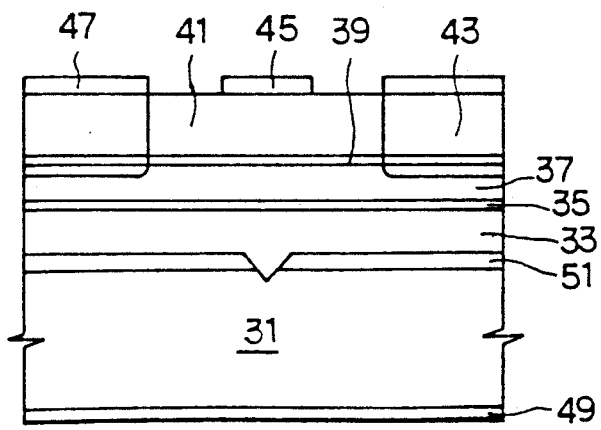
FIG. 4 is another embodiment of a compound semiconductor device according to the present invention.

FIG. 4 is another embodiment of the compound semiconductor device according to the present invention.

The embodiment shown in FIG. 4 inserts a sixth compound semiconductor layer 51 between the compound semiconductor substrate 31 and the first compound semiconductor layer 33 as shown in FIG. 2 to lower the threshold current.

The sixth compound semiconductor layer 51 of N-type GaAs is formed in a stripe shape at a corresponding position relative to the vertical axis of the first electrode 45. In other words, the sixth compound semiconductor layer 51 has a stripe-shaped V-channel formed by cutting the compound semiconductor substrate 31 down to a predetermined depth, so that the holes injected through the third electrode 49 flow only in the V-channel to lower the threshold current.

The equivalent circuit of FIG. 4 is formed in the same manner as that of FIG. 3.

As described above, according to the present invention, the topography becomes flat and the LD is driven fast by the HBT since the HBT is formed in the vertical structure of the LD, holding many layers in common. Also, the flow of the holes only in the predetermined part is obtained by providing the layer for restricting the flow of holes, thereby lowering the threshold current.

Thus, the present invention can minimize the area of the compound semiconductor device and obtain a flat topography.

What is claimed is:

1. A compound semiconductor device which incorporates a laser diode and a heterojunction bipolar transistor in the same chip, the device comprising:

a laser diode comprising:
a first conductive type compound semiconductor substrate,
a first compound semiconductor layer of a first conductive type formed on said compound semiconductor substrate as a lower cladding layer,
a second compound semiconductor layer formed on said first compound semiconductor layer for emitting light,
a third compound semiconductor layer of a second conductive type formed on said second compound semiconductor layer as an upper cladding layer, and
a third electrode formed on said semiconductor substrate; and a heterojunction bipolar transistor comprising:
a fourth compound semiconductor layer of the first conductive type formed on said third compound semiconductor layer as a base region,
a fifth compound semiconductor layer of the second conductive type formed on said fourth compound semiconductor layer as an emitter region,
a first electrode of the second conductive type formed on a predetermined part of said fifth compound semiconductor layer,
a second electrode of the first conductive type formed on both sides of said first electrode on said fifth compound semiconductor layer,
a first conductive type impurity region under said second electrode and overlapping said third compound semiconductor layer to a predetermined depth for connecting said third compound semiconductor layer to said fourth compound semiconductor layer electrically, and
a third compound semiconductor layer serving as a collector region, which is used in common with said laser diode.

2. The compound semiconductor device according to claim 1, wherein said heterojunction bipolar transistor is formed as a vertical structure in said laser diode.

3. The compound semiconductor device according to claim 2, wherein said heterojunction bipolar transistor drives said laser diode.

4. The compound semiconductor device according to claim 3, wherein the light emitted by said laser diode has an intensity proportional to the number of minority carriers injected into said fourth compound semiconductor layer.

5. The compound semiconductor device according to claim 1, wherein said fifth compound semiconductor layer has an energy bandgap which is substantially the same as that of said third compound semiconductor layer.

6. The compound semiconductor device according to claim 1, wherein said sixth compound semiconductor layer is formed between said compound semiconductor substrate and said first compound semiconductor layer by providing a V-channel and exposing said compound semiconductor substrate.

7. The compound semiconductor device according to claim 6, wherein said V-channel is formed in a corresponding position relative to a vertical axis of said first electrode.

* * * * *